United States Patent
Tsai

(10) Patent No.: US 11,205,651 B2
(45) Date of Patent: Dec. 21, 2021

(54) MEMORY STRUCTURE AND METHOD FOR MANUFACTURING THE SAME

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/798,433

(22) Filed: Feb. 24, 2020

(65) Prior Publication Data

US 2021/0265358 A1 Aug. 26, 2021

(51) Int. Cl.
| | |
|---|---|
| H01L 27/108 | (2006.01) |
| H01L 29/786 | (2006.01) |
| H01L 29/423 | (2006.01) |
| H01L 29/66 | (2006.01) |
| H01L 29/10 | (2006.01) |
| H01L 29/08 | (2006.01) |

(52) U.S. Cl.
CPC .. *H01L 27/10832* (2013.01); *H01L 27/10873* (2013.01); *H01L 29/0847* (2013.01); *H01L 29/1037* (2013.01); *H01L 29/42392* (2013.01); *H01L 29/66742* (2013.01); *H01L 29/78642* (2013.01)

(58) Field of Classification Search
None
See application file for complete search history.

(56) References Cited

U.S. PATENT DOCUMENTS

| | | | |
|---|---|---|---|
| 6,806,140 B1 | 10/2004 | Kim et al. | |
| 2002/0167010 A1* | 11/2002 | Mueller | C30B 23/00 257/77 |
| 2018/0294239 A1* | 10/2018 | Sakata | H01L 24/13 |

FOREIGN PATENT DOCUMENTS

TW  I368315  7/2012

OTHER PUBLICATIONS

Cho et al., "Suppression of the Floating-Body Effect of Vertical-Cell DRAM With the Buried Body Engineering Method." IEEE Transactions on Electron Devices, vol. 65, No. 8, Jun. 26, 2018, pp. 1-6 (Year: 2018).*

(Continued)

*Primary Examiner* — Anthony Ho
*Assistant Examiner* — Kevin Quinto
(74) *Attorney, Agent, or Firm* — JCIPRNET

(57) ABSTRACT

Provided are a memory structure and a method for manufacturing the same. The memory structure includes a capacitor and a transistor disposed thereon and electrically connected thereto. The transistor includes a first and a source/drain layers, a channel pillar, a gate, a gate dielectric layer, a doped layer, and a spacer layer. The first source/drain layer is electrically connected to the capacitor. The channel pillar is on the first source/drain layer. The gate is on a sidewall of the channel pillar. The gate dielectric layer is between the gate and the channel pillar. The doped layer is on the sidewall of the channel pillar and above the gate. The spacer layer is between the gate and the first source/drain layer and between the gate and the doped layer. The second source/drain layer is on or in the channel pillar.

12 Claims, 6 Drawing Sheets

(56) References Cited

OTHER PUBLICATIONS

Youngseung Cho, et al., "Suppression of the Floating-Body Effect of Vertical-Cell DRAM With the Buried Body Engineering Method." IEEE Transactions on Electron Devices, vol. 65, No. 8, Jun. 26, 2018, pp. 1-6.
Youngseung Cho, et al., "Novel Band-to-Band Tunneling Body Contact (BTBC) Structure to Suppress the Floating-Body Effect in a Vertical-Cell DRAM." IEEE Electron Device Letters, vol. 39, No. 12, Oct. 8, 2018, pp. 1-4.
"Office Action of Taiwan Counterpart Application", dated Dec. 23, 2020, pp. 1-3.

* cited by examiner

MEMORY STRUCTURE AND METHOD FOR MANUFACTURING THE SAME

BACKGROUND OF THE INVENTION

1. Field of the Invention

The invention relates to a semiconductor structure and a method for manufacturing the same, and in particular, to a memory structure and a method for manufacturing the same.

2. Description of Related Art

Currently, a memory structure including a transistor and a capacitor is developed. In such a memory structure, the capacitor is used as a storage device. Under the current trend of increasing a device integration degree, how to effectively improve electrical performance of a device of a memory without increasing a size of a memory cell is a current goal of the industry with ongoing efforts. In the current technology, a vertical transistor may replace a horizontal transistor to save a layout area of the memory cell and increase the device integration degree.

SUMMARY OF THE INVENTION

The invention provides a memory structure having a vertical transistor.

The invention provides a method for manufacturing a memory structure to manufacture the foregoing memory structure.

The memory structure of the invention includes a capacitor and a transistor. The transistor array is disposed above and electrically connected to the capacitor. The transistor includes a first source/drain layer, a channel pillar, a gate, a gate dielectric layer, a doped layer, a spacer layer, and a second source/drain layer. The first source/drain layer is electrically connected to the capacitor. The channel pillar is disposed on the first source/drain layer. The gate is disposed on a sidewall of the channel pillar. The gate dielectric layer is disposed between the gate and the channel pillar. The doped layer is disposed on the sidewall of the channel pillar and is located above the gate. The spacer layer is disposed between the gate and the first source/drain layer and between the gate and the doped layer. The second source/drain layer is disposed on or in the channel pillar. The first source/drain layer and the second source/drain layer are of a first conductivity type, and the doped layer is of a second conductivity type.

In an embodiment of the memory structure of the invention, a protective layer disposed on the doped layer is further included.

In an embodiment of the memory structure of the invention, the second source/drain layer is extended onto the protective layer.

In an embodiment of the memory structure of the invention, the first source/drain layer includes a doped silicon layer.

In an embodiment of the memory structure of the invention, the second source/drain layer includes a doped silicon layer or a doped region located in the channel pillar.

In an embodiment of the memory structure of the invention, the doped layer includes a doped silicon layer.

In an embodiment of the memory structure of the invention, in a top view, the doped layer, the spacer layer, and the gate are extended in a same direction.

The method for manufacturing the memory structure includes the following steps: forming a contact on a capacitor; and forming a transistor on the contact. The transistor includes a first source/drain layer, a channel pillar, a gate, a gate dielectric layer, a doped layer, a spacer layer, and a second source/drain layer. The first source/drain layer is connected to the contact. The channel pillar is formed on the first source/drain layer. The gate is formed on a sidewall of the channel pillar. The gate dielectric layer is formed between the gate and the channel pillar. The doped layer is formed on the sidewall of the channel pillar and is located above the gate. The spacer layer is formed between the gate and the first source/drain layer and between the gate and the doped layer. The second source/drain layer is formed on or in the channel pillar. The first source/drain layer and the second source/drain layer are of a first conductivity type, and the doped layer is of a second conductivity type.

In an embodiment of the method for manufacturing the memory structure of the invention, the method for forming a transistor includes the following steps: forming a first source/drain layer on the contact; forming a sacrificial layer on the first source/drain layer; forming a first spacer layer on a sidewall of the sacrificial layer; forming a gate dielectric layer on the sidewall of the sacrificial layer above the first spacer layer; forming a gate on the gate dielectric layer; forming a second spacer layer on the sidewall of the sacrificial layer above the gate; forming a doped layer on the second spacer layer and the sacrificial layer; removing the sacrificial layer and the doped layer above the sacrificial layer to form a channel hole; forming the channel pillar in the channel hole; and forming a second source/drain layer on or in the channel pillar.

In an embodiment of the method for manufacturing the memory structure of the invention, after the forming a doped layer and before the forming a channel hole, the method further includes forming a protective layer on the doped layer.

In an embodiment of the method for manufacturing the memory structure of the invention, the second source/drain layer is extended onto the protective layer.

In an embodiment of the method for manufacturing the memory structure of the invention, in a top view, the doped layer, the spacer layer, and the gate are extended in a same direction.

Based on the above, in the memory structure of the invention, since the doped layer is disposed between the source/drain layer and the gate, holes may be prevented from accumulating between the source/drain layer and the gate during operation of the memory structure, and the holes may be guided out through the doped layer to improve a floating-body effect.

To make the features and advantages of the invention clear and easy to understand, the following gives a detailed description of embodiments with reference to accompanying drawings.

DESCRIPTION OF THE EMBODIMENTS

The following makes detailed description by listing embodiments and with reference to accompanying drawings, but the provided embodiments are not intended to limit the scope covered by the present invention. In addition, the drawings are drawn only for the purpose of description, and are not drawn according to original sizes. For ease of understanding, same elements in the following description are described by using same signs.

Terms such as "includes", "comprises", and "having" used herein are all inclusive terms, namely, mean "includes but not limited to".

In addition, the directional terms mentioned herein, like "above" and "below", are only used to refer to the directions in the accompanying drawings and are not intended to limit the invention.

In addition, the "first conductivity type" mentioned in the specification is one of n type and p type, and the "second conductivity type" is the other of n type and p type.

FIG. 1A to FIG. 1D are each a schematic top view of a manufacturing process of a memory structure according to an embodiment of the invention. FIG. 2A to FIG. 2D are each a schematic cross-sectional view of a manufacturing process taken along line A-A in FIG. 1A to FIG. 1D.

Figure 1A:
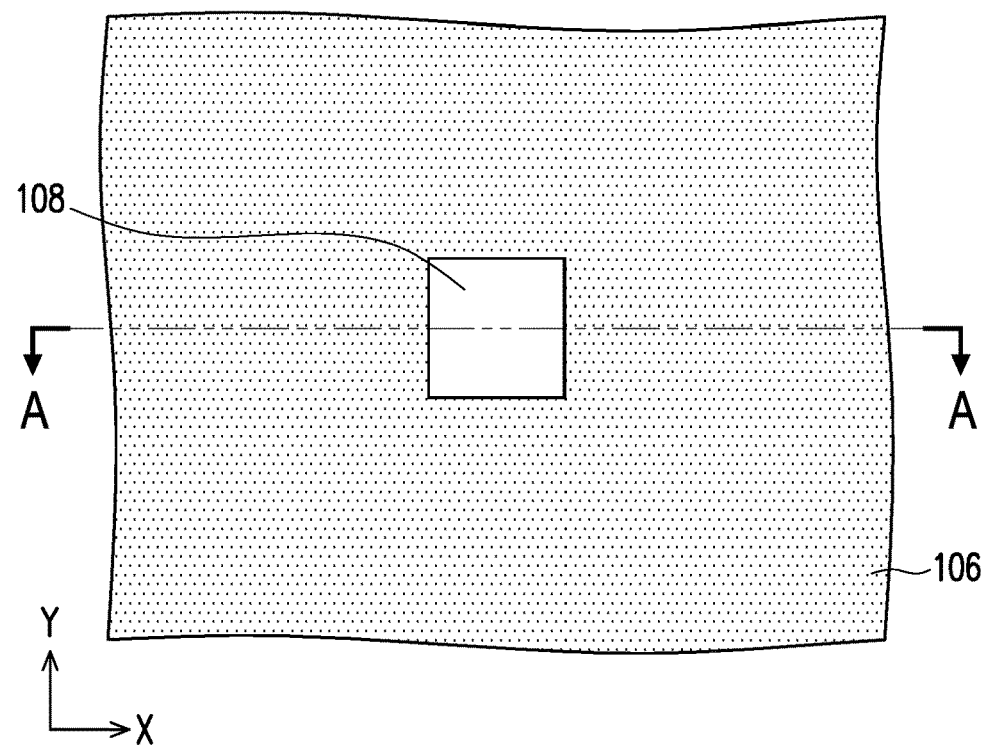
FIG. 1A to FIG. 1D are each a schematic top view of a manufacturing process of a memory structure according to an embodiment of the invention.
Figure 2A:
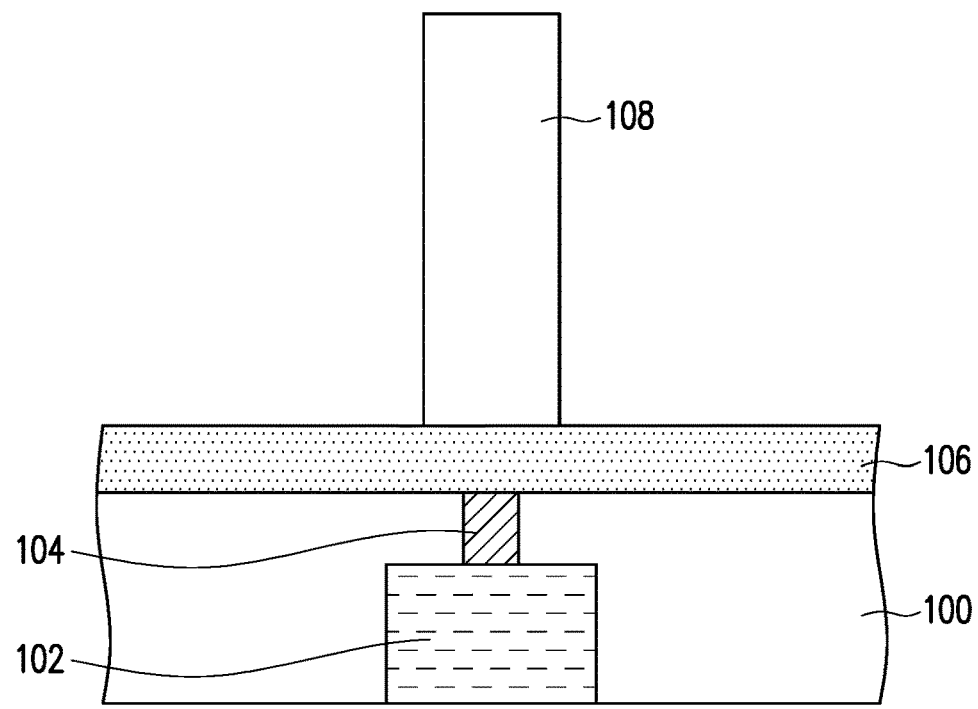
FIG. 2A to FIG. 2D are each a schematic cross-sectional view of a manufacturing process taken along line A-A in FIG. 1A to FIG. 1D.

First, referring to FIG. 1A and FIG. 2A together, a substrate 100 is provided. The substrate 100 is, for example, a dielectric substrate. In the present embodiment, a capacitor 102 and a contact 104 connected to the capacitor 102 have been formed in the substrate 100. The capacitor 102 may be any known capacitor, which is not limited in the invention. A method for forming the capacitor 102 and the contact 104 is known by those skilled in the art, and the descriptions thereof are omitted herein. Then, a source/drain layer 106 of a first conductivity type is formed on the substrate 100. The source/drain layer 106 is made of, for example, doped polysilicon. The method for forming the source/drain layer 106 is, for example, first forming a polysilicon layer on the substrate 100, and then implanting a dopant of a first conductivity type into the polysilicon layer. Alternatively, the method for forming the source/drain layer 106 is, for example, directly forming a polysilicon layer of a dopant including a first conductivity type. Next, a sacrificial layer 108 is formed on the source/drain layer 106. In the present embodiment, the sacrificial layer 108 may be an oxide layer or a polysilicon layer. In addition, after the sacrificial layer 108 is formed, a protective layer (not shown) may be selectively formed on a surface of the sacrificial layer 108.

Figure 1B:
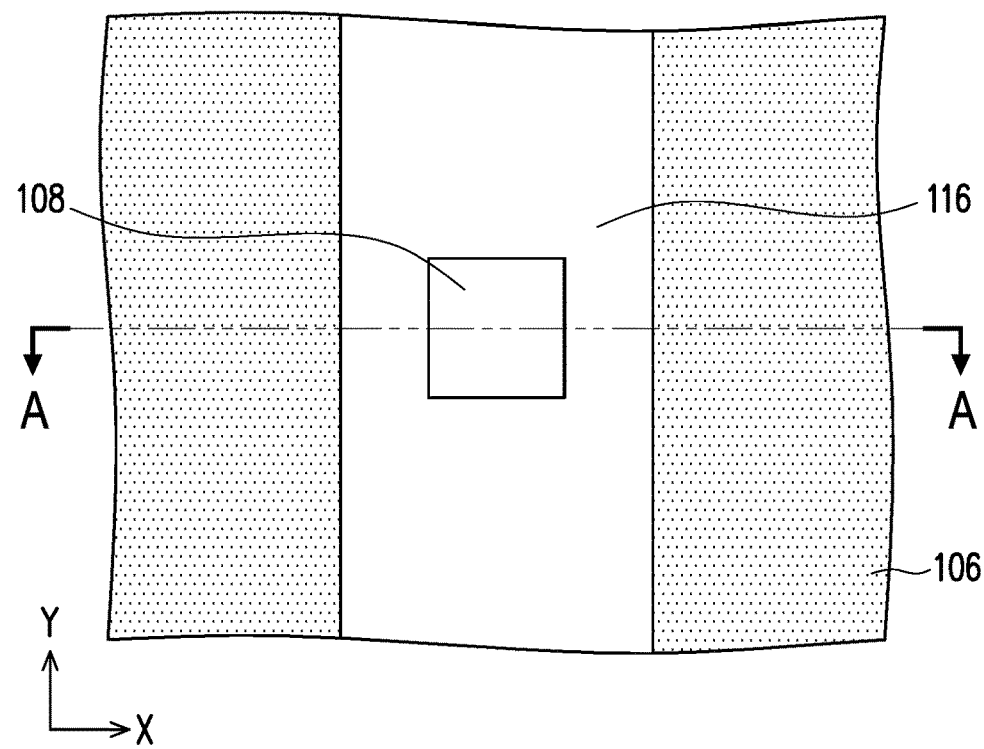
Figure 2B:
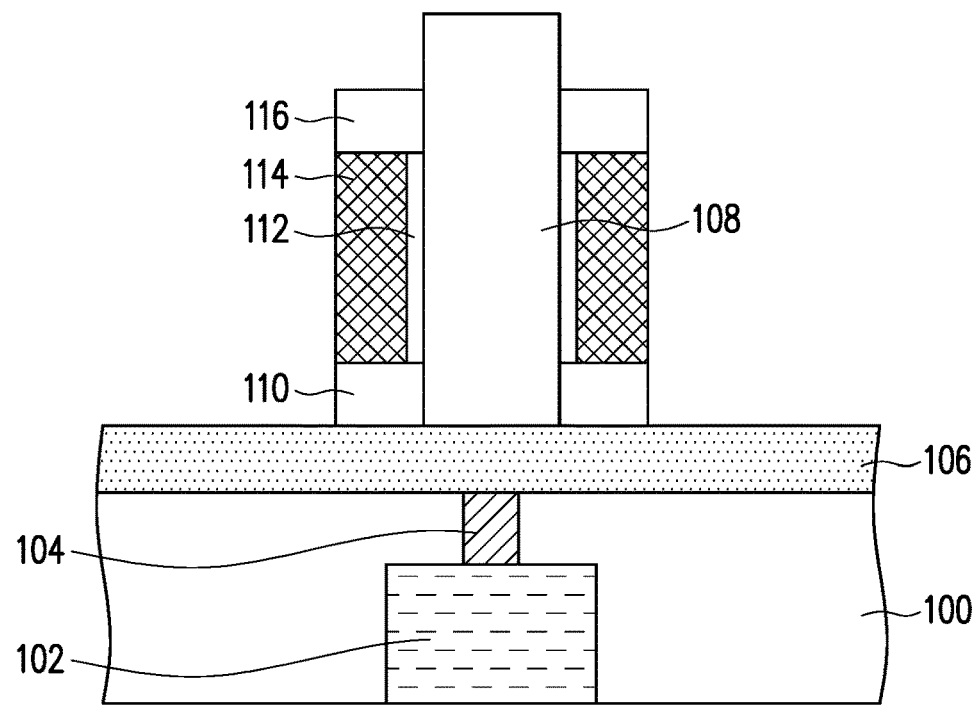

Next, referring to FIG. 1B and FIG. 2B together, a spacer layer 110 is formed on the sidewall of the sacrificial layer 108. The spacer layer 110 is located at a bottom of the sacrificial layer 108. In the present embodiment, the spacer layer 110 is, for example, a nitride layer. The method for forming the spacer layer 110 is, for example, first forming a spacer material layer conformally on the substrate 100, and then performing an anisotropic etching process to remove a portion of the spacer material layer until the remaining spacer material layer has a desired height. Then a gate dielectric layer 112 is formed on the sidewall of the sacrificial layer 108 above the spacer layer 110. In the present embodiment, the gate dielectric layer 112 is, for example, an oxide layer. The method for forming the gate dielectric layer 112 is, for example, first forming a dielectric material layer conformally on the substrate 100, and then performing an anisotropic etching process to remove a portion of the dielectric material layer until the remaining dielectric material layer has a desired height. Next, a gate 114 is formed on the gate dielectric layer 112. In the present embodiment, the gate 114 is made of, for example, polysilicon or metal. The method for forming the layer 114 is, for example, first forming a gate material layer conformally on the substrate 100, and then performing an anisotropic etching process to remove a portion of the gate material layer until the remaining gate material layer has a height less than a height of the gate dielectric layer 112. In the present embodiment, a height of a top surface of the gate 114 from the substrate 110 is the same as a height of a top surface of the gate dielectric layer 112 from the substrate 110, that is, the top surface of the gate 114 and the top surface of the gate dielectric layer 112 are coplanar. Then a spacer layer 116 is formed on the sidewall of the sacrificial layer 108 above the gate 114. In the present embodiment, the material and the forming method of the spacer layer 116 are the same as that of the spacer layer 110, and the descriptions thereof are omitted herein. In addition, in the present embodiment, a top surface of the spacer layer 116 is lower than a top surface of the sacrificial layer 108, but the invention is not limited thereto. In other embodiments, a top surface of the spacer layer 116 may alternatively be coplanar with a top surface of the sacrificial layer 108.

In the present embodiment, the spacer layer 110, the gate dielectric layer 112, the gate 114, and the spacer layer 116 are disposed around the sacrificial layer 108 and extended on the substrate 100 in a first direction. As shown in FIG. 1B, in a top view, the spacer layer 110, the gate dielectric layer 112, the gate 114, and the spacer layer 116 are disposed around the sacrificial layer 108 and extended on the substrate 100 in a direction Y. Therefore, the gate 114 extended in the direction Y may be regarded as a word line of the memory structure of the invention.

Figure 1C:
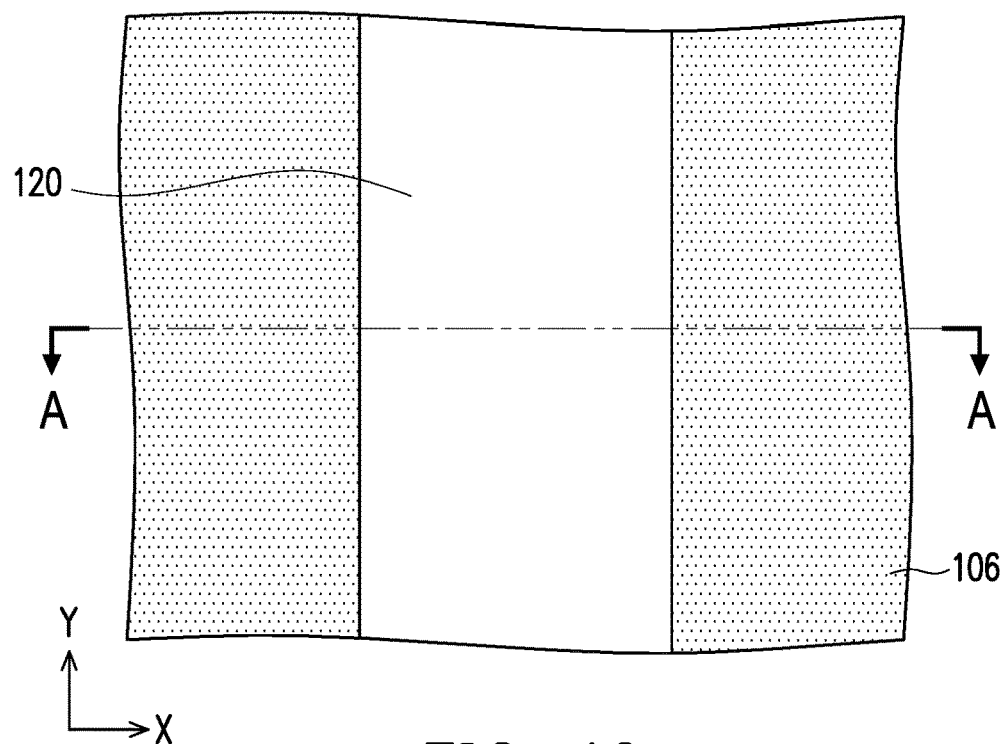
Figure 2C:
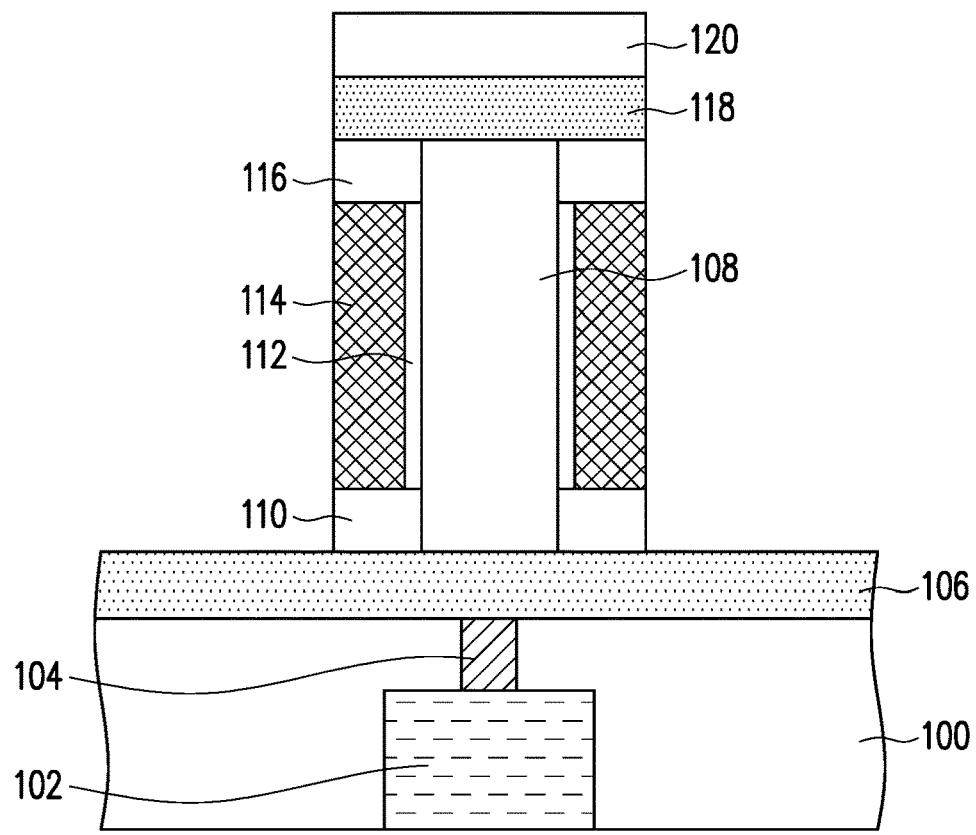

Then, referring to FIG. 1C and FIG. 2C together, a planarization process is performed to remove a portion of the sacrificial layer 108 until the top surface of the sacrificial layer 108 is coplanar with the top surface of the spacer layer 116. The foregoing planarization process is, for example, a chemical mechanical polishing process. In another embodiment, when the top surface of the spacer layer 116 formed in the step described in FIG. 1B and FIG. 2B and the top surface of the sacrificial layer 108 are coplanar, the foregoing planarization process may be omitted. Then a doped layer 118 of a second conductivity type is formed on the spacer layer 116 and the sacrificial layer 108. In the present embodiment, since the top surface of the sacrificial layer 108 and the top surface of the spacer layer 116 are coplanar, it may be ensured that the formed doped layer 118 is flat to facilitate the subsequent formation of other devices. In the present embodiment, the doped layer 118 is made of, for example, doped polysilicon. The method for forming the doped layer 118 is, for example, first forming a polysilicon layer on the substrate 100, then implanting a dopant of a second conductivity type into the polysilicon layer, and performing a patterning process on the polysilicon layer. Alternatively, the method for forming the doped layer 118 is, for example, directly forming a polysilicon layer of a dopant including a second conductivity type, and then performing a patterning process on the polysilicon layer. Next, a protective layer 120 is formed on the doped layer 118. In the present embodiment, the protective layer 120 is, for example, an oxide layer, a metal layer, or a combination thereof. The method for forming the protective layer 120 is, for example, first conformally forming a protective material layer on the substrate 100, and then performing a patterning process on the protective material layer.

In the present embodiment, the doped layer 118 and the protective layer 120 that are formed are formed on the spacer layer 116 and the sacrificial layer 108 and extended in the first direction. As shown in FIG. 1C, in a top view, the doped layer 118 and the protective layer 120 are extended in the direction Y on the substrate 100, that is, the doped layer 118 and the word line are disposed in parallel with each other.

Figure 1D:
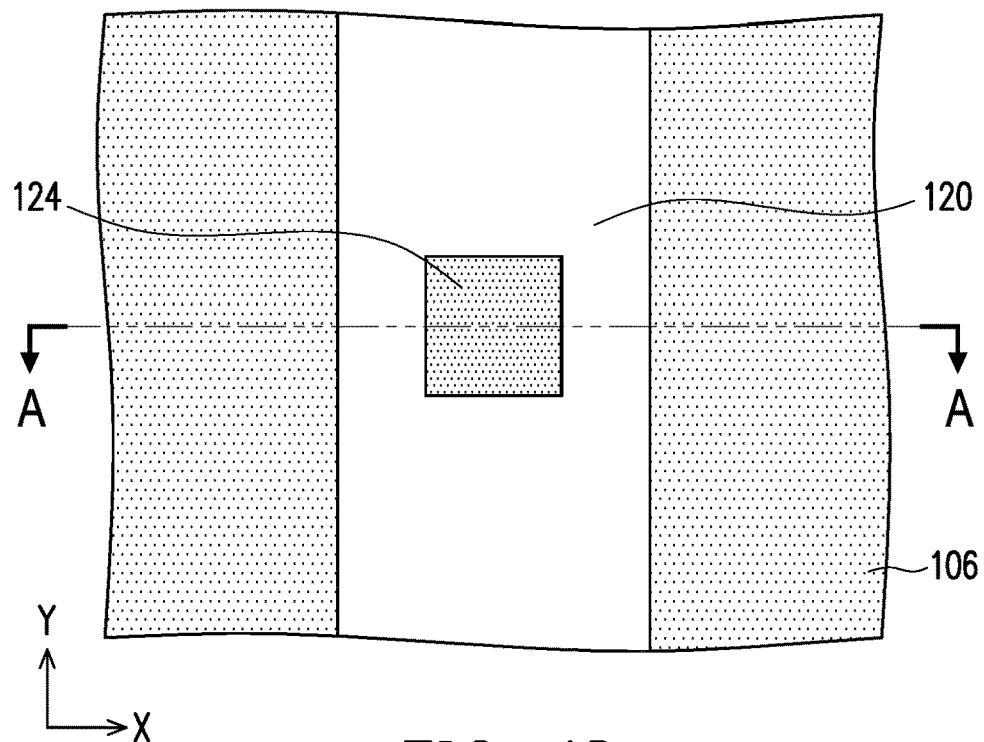
Figure 2D:
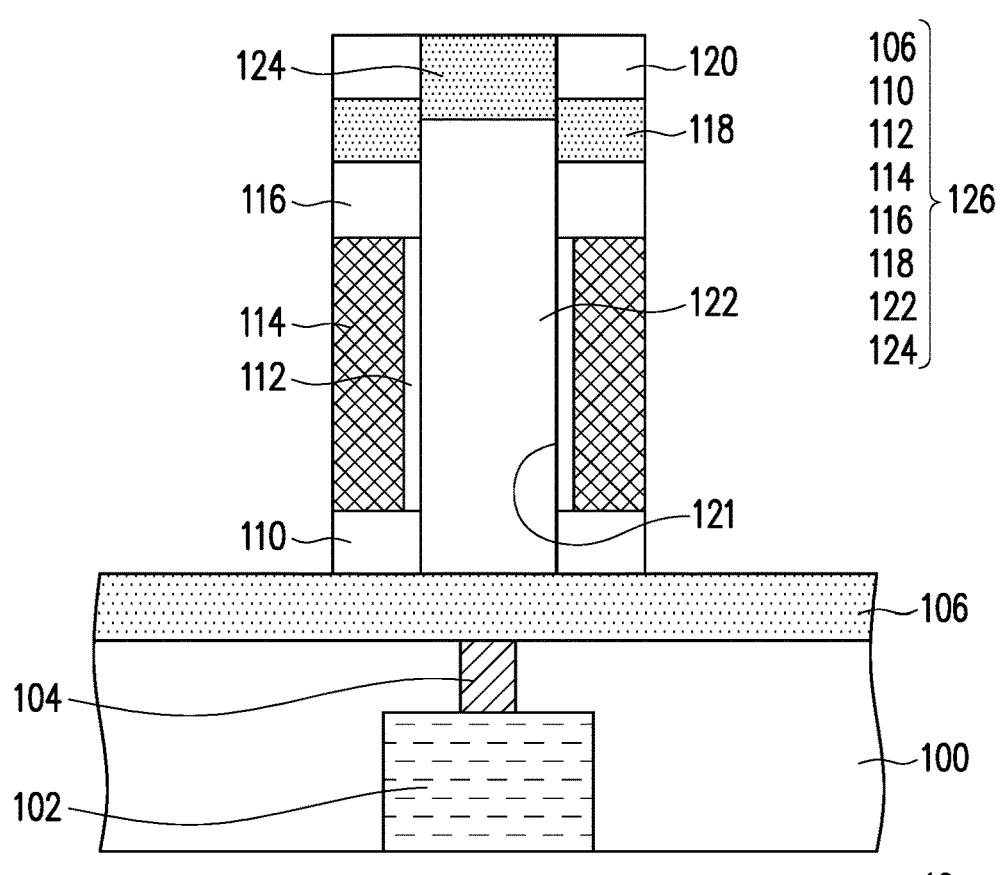

Thereafter, referring to FIG. 1D and FIG. 2D together, the sacrificial layer 108 and the doped layer 118 and the protective layer 120 thereon are removed to form a channel hole 121. In the present embodiment, the method for forming the channel hole 121 is, for example, first forming, on the protective layer 120, a patterned mask layer exposed from a region corresponding to a position of the sacrificial layer, and then using the patterned mask layer as an etching mask to perform an anisotropic etching process, to remove a portion of the protective layer 120, a portion of the doped layer 118, and an entire sacrificial layer 108 (when a protective layer is formed on the surface of the sacrificial layer, the sacrificial layer 108 and the protective layer are both removed). Next, a channel pillar 122 is formed in the channel hole 121. In the present embodiment, the channel pillar 122 is made of, for example, undoped polysilicon or polysilicon doped with a dopant of a second conductivity type. In the present embodiment, a top surface of the channel pillar 122 is coplanar with a top surface of the protective layer 120. Then, a source/drain layer 124 is formed in an upper portion of the channel pillar 122. In the present embodiment, the method for forming the source/drain layer 124 is, for example, performing an ion implantation process to implant a dopant of a first conductivity type into the upper portion of the channel pillar 122. In other words, in the present embodiment, the source/drain layer 124 is located in a doped region in the upper portion of the channel pillar 122. In this way, the memory structure 10 of the present embodiment is completed. In the present embodiment, the source/drain layer 106, the spacer layer 110, the gate dielectric layer 112, the gate 114, the spacer layer 116, the doped layer 118, the channel pillar 122, and the source/drain layer 124 constitute a transistor 126. In addition, after the memory structure 10 is formed, a subsequent process may be performed to form a bit line that is extended in a second direction (a direction X in the present embodiment) interlaced with the first direction and that is connected to the source/drain layer 124. In other words, in the present embodiment, the source/drain layer 124 may be used as a contact of the bit line.

The memory structure 10 is used as an example to describe the memory structure of the invention.

As shown in FIG. 1D and FIG. 2D, the memory structure 10 includes a capacitor 102 and a transistor 126. The transistor 126 is electrically connected to the capacitor 102 through a contact 104. The transistor 126 includes a source/drain layer 106, a spacer layer 110, a gate dielectric layer 112, a gate 114, a spacer layer 116, a doped layer 118 of a second conductivity type, a channel pillar 122, and a source/drain layer 124 of a first conductivity type. The source/drain layer 106 is connected to the contact 104. The channel pillar 122 is disposed on the source/drain layer 106. The gate 114 is disposed on a sidewall of the channel pillar 122. The gate dielectric layer 122 is disposed between the gate 114 and the channel pillar 122. The doped layer 118 is disposed on the sidewall of the channel pillar 122 and located above the gate 114. The spacer layer 110 is disposed between the gate 114 and the source/drain layer 106. The spacer layer 116 is disposed between the gate 114 and the doped layer 118. The source/drain layer 124 is disposed in the upper portion of the channel pillar 122.

In the memory structure 10, since the doped layer 118 is disposed between the source/drain layer 124 and the gate 114, holes may be prevented from accumulating between the source/drain layer 124 and the gate 114 during operation of the memory structure 10, and the holes may be guided out through the doped layer 118 to improve a floating-body effect. For example, a contact connected to the doped layer 118 may be formed in a subsequent process (for example, formed at one end or two opposite ends of the doped layer 118 extended in the direction Y), to guide out accumulated holes during operation via the doped layer 118 and the contact connected to the doped layer 118.

In addition, in the memory structure 10, the protective layer 120 is formed on the doped layer 118 of the second conductivity type. Therefore, when the source/drain layer 124 of the first conductivity type is formed, a dopant of the first conductivity type may be prevented from entering the doped layer 118 of the second conductivity type, but the invention is not limited thereto. In other embodiments, the protective layer 120 may be omitted, which is described below.

In the present embodiment, the source/drain layer 124 is located in a doped region in the upper portion of the channel pillar 122, but the invention is not limited thereto. In other embodiments, the source/drain layer 124 may be additionally formed on the channel pillar 122, which is described below.

Figure 3:
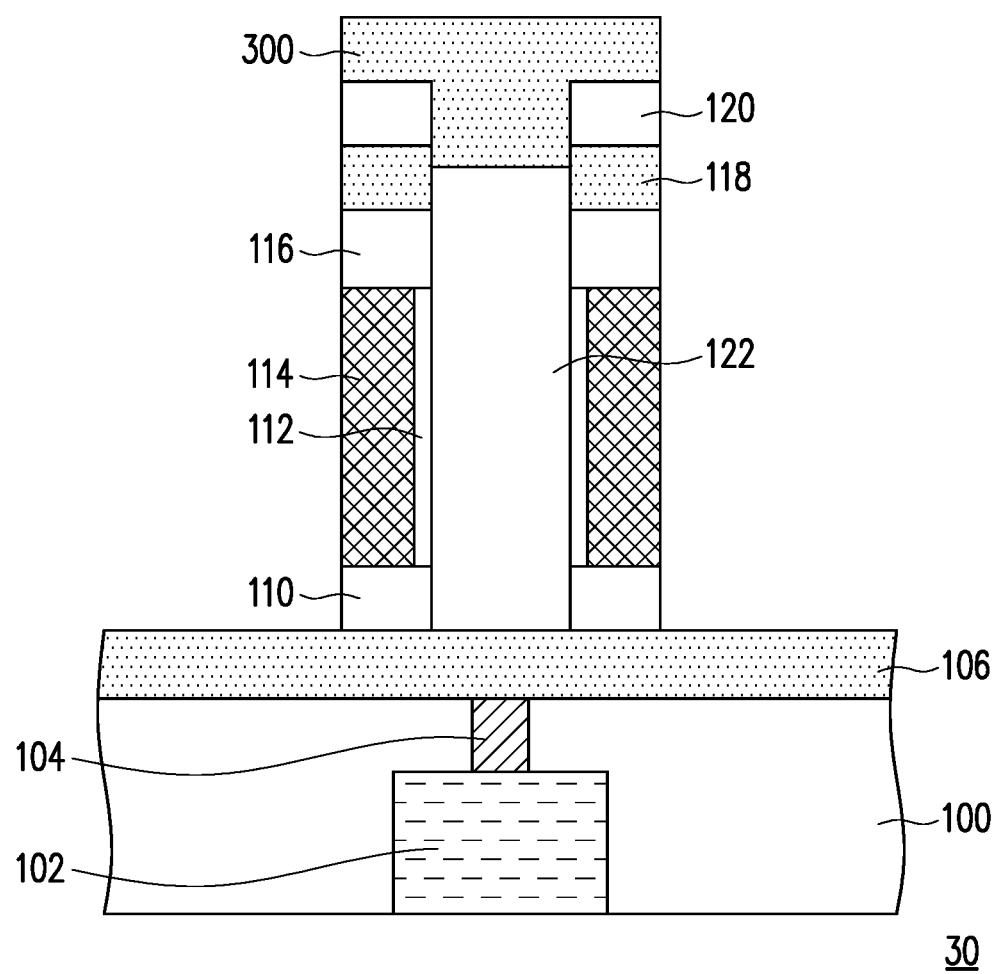
FIG. 3 is a schematic cross-sectional view of a memory structure according to another embodiment of the invention.

FIG. 3 is a schematic cross-sectional view of a memory structure according to another embodiment of the invention. In the present embodiment, a device the same as that in FIG. 2D is represented with a same device symbol, and the descriptions thereof are omitted.

Referring to FIG. 3, in the memory structure 30 of the present embodiment, the top surface of the channel pillar 122 is lower than the top surface of the protective layer 120 and is not lower than a bottom surface of the doped layer 118. In addition, a source/drain layer 300 is disposed on the channel pillar 122 and extended to the protective layer 120. In other words, after the channel pillar 122 is formed as described in FIG. 1D and FIG. 2D, an etching back process is performed, or the channel pillar 122 whose top surface is lower than the top surface of the protective layer 120 is directly formed, then the source/drain layer 300 is formed on the protective layer 120, and the channel hole 121 is filled with the source/drain layer 300.

In the present embodiment, since the source/drain layer 300 is extended to the protective layer 120, there may be a larger contact area between the source/drain layer and the bit lines to be formed later, to facilitate electrical connection between the source/drain layer 300 and the bit lines.

Figure 4:
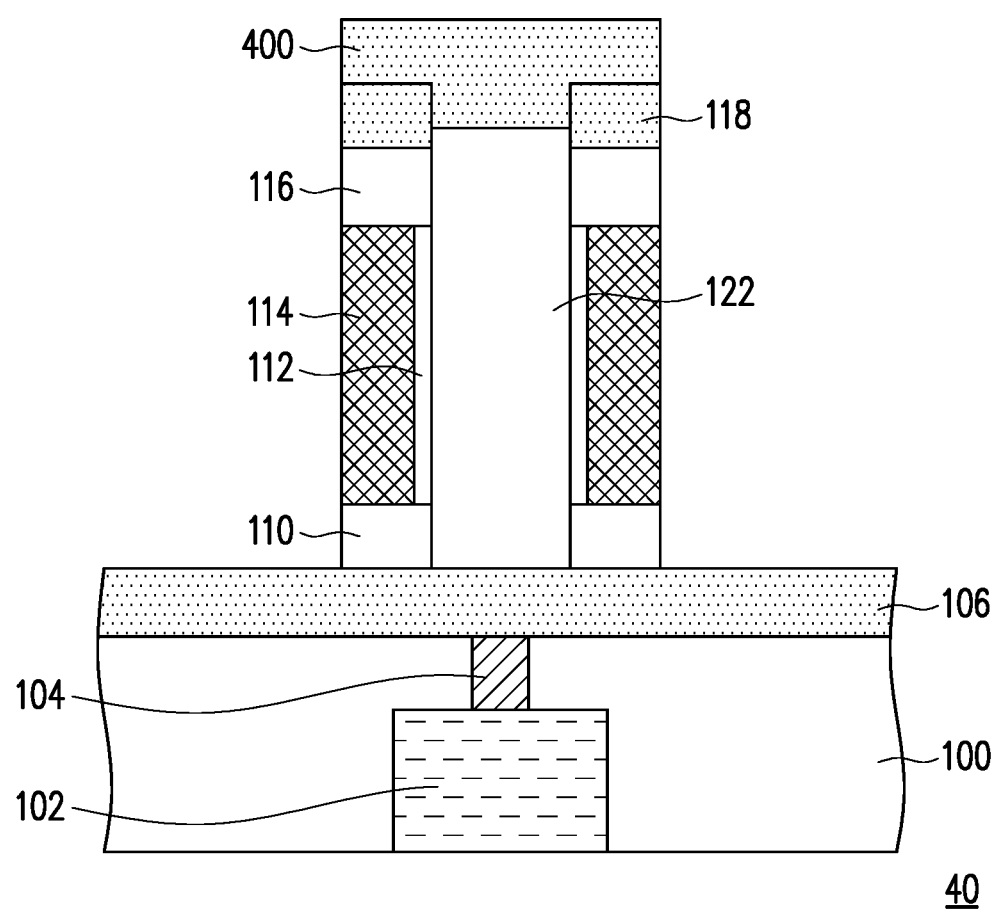
FIG. 4 is a schematic cross-sectional view of a memory structure according to another embodiment of the invention.

FIG. 4 is a schematic cross-sectional view of a memory structure according to another embodiment of the invention. In the present embodiment, a device the same as that in FIG. 2D is represented with a same device symbol, and the descriptions thereof are omitted.

Referring to FIG. 4, in the memory structure 40 of the present embodiment, a protective layer is not disposed on the doped layer 118 of the second conductivity type. In addition, a source/drain layer 400 is disposed on a channel pillar 122 and extended to the doped layer 118. In other words, after the channel pillar 122 is formed as described in FIG. 1D and FIG. 2D, an etching back process is performed, or the channel pillar 122 whose top surface is lower than the top surface of the protective layer 120 is directly formed, then the source/drain layer 400 is formed on the doped layer 118, and the channel hole 121 is filled with the source/drain layer 400.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A memory structure, comprising:
    a capacitor; and
    a transistor disposed above and electrically connected to the capacitor, wherein the transistor comprises:
        a first source/drain layer electrically connected to the capacitor;
        a channel pillar disposed on the first source/drain layer;
        a gate disposed on a sidewall of the channel pillar;
        a gate dielectric layer disposed between the gate and the channel pillar;
        a doped layer disposed on the sidewall of the channel pillar and located above the gate;
        a spacer layer disposed between the gate and the first source/drain layer and between the gate and the doped layer; and
        a second source/drain layer disposed on or in the channel pillar, wherein
    the first source/drain layer and the second source/drain layer are of a first conductivity type, and the doped layer is of a second conductivity type.

2. The memory structure according to claim 1, further comprising a protective layer disposed on the doped layer.

3. The memory structure according to claim 2, wherein the second source/drain layer is extended onto the protective layer.

4. The memory structure according to claim 1, wherein the first source/drain layer comprises a doped silicon layer.

5. The memory structure according to claim 1, wherein the second source/drain layer comprises a doped silicon layer or a doped region located in the channel pillar.

6. The memory structure according to claim 1, wherein the doped layer comprises a doped silicon layer.

7. The memory structure according to claim 1, wherein in a top view, the doped layer, the spacer layer, and the gate are extended in a same direction.

8. A method for manufacturing a memory structure, comprising:
    forming a contact on a capacitor; and
    forming a transistor on the contact, wherein the transistor comprises:
        a first source/drain layer connected to the contact;
        a channel pillar formed on the first source/drain layer;
        a gate formed on a sidewall of the channel pillar;
        a gate dielectric layer formed between the gate and the channel pillar;
        a doped layer formed on the sidewall of the channel pillar and located above the gate;
        a spacer layer formed between the gate and the first source/drain layer and between the gate and the doped layer; and
        a second source/drain layer formed on or in the channel pillar, wherein
    the first source/drain layer and the second source/drain layer are of a first conductivity type, and the doped layer is of a second conductivity type.

9. The method for manufacturing the memory structure according to claim 8, wherein the method for forming a transistor comprises:
    forming a first source/drain layer on the contact;
    forming a sacrificial layer on the first source/drain layer;
    forming a first spacer layer on a sidewall of the sacrificial layer;
    forming a gate dielectric layer on the sidewall of the sacrificial layer above the first spacer layer;
    forming a gate on the gate dielectric layer;
    forming a second spacer layer on the sidewall of the sacrificial layer above the gate;
    forming a doped layer on the second spacer layer and the sacrificial layer;
    removing the sacrificial layer and the doped layer above the sacrificial layer to form a channel hole;
    forming the channel pillar in the channel hole; and
    forming a second source/drain layer on or in the channel pillar.

10. The method for manufacturing the memory structure according to claim 9, after the forming a doped layer and before the forming a channel hole, further comprising forming a protective layer on the doped layer.

11. The method for manufacturing the memory structure according to claim 10, wherein the second source/drain layer is extended onto the protective layer.

12. The method for manufacturing the memory structure according to claim 8, wherein in a top view, the doped layer, the spacer layer, and the gate are extended in a same direction.

* * * * *